United States Patent
Zhang

(10) Patent No.: US 11,300,644 B2
(45) Date of Patent: Apr. 12, 2022

(54) NUCLEAR QUADRUPOLE RESONANCE DETECTION SYSTEM AND ANTENNA

(71) Applicant: Maisonburg (Shenzhen)Technology Development Co., Ltd., Shenzhen (CN)

(72) Inventor: Tongsheng Zhang, Shenzhen (CN)

(73) Assignee: MAISONBURG (SHENZHEN) TECHNOLOGY DEVELOPMENT CO., LTD., Shenzhen (CN)

( * ) Notice: Subject to any disclaimer, the term of this patent is extended or adjusted under 35 U.S.C. 154(b) by 0 days.

(21) Appl. No.: 16/959,320

(22) PCT Filed: Jan. 8, 2018

(86) PCT No.: PCT/CN2018/071718
§ 371 (c)(1),
(2) Date: Jun. 30, 2020

(87) PCT Pub. No.: WO2019/134160
PCT Pub. Date: Jul. 11, 2019

(65) Prior Publication Data
US 2020/0371179 A1    Nov. 26, 2020

(51) Int. Cl.
*G01R 33/34*    (2006.01)
*G01R 33/44*    (2006.01)
*G01R 33/36*    (2006.01)

(52) U.S. Cl.
CPC ........... *G01R 33/441* (2013.01); *G01R 33/34* (2013.01); *G01R 33/3614* (2013.01)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 6,078,177 A    6/2000  Petropoulos et al.
6,194,898 B1 *  2/2001  Magnuson ........... G01R 33/441
                                                324/300
(Continued)

FOREIGN PATENT DOCUMENTS

CN    101006609 A    7/2007
CN    101504381 A    8/2009
(Continued)

OTHER PUBLICATIONS

English Translation to International Search Report for Application No. PCT/CN2018/071718.
(Continued)

*Primary Examiner* — Patrick Assouad
*Assistant Examiner* — Taqi R Nasir
(74) *Attorney, Agent, or Firm* — Soroker Agmon Nordman PTE Ltd

(57) ABSTRACT

The technology disclosed in this invention belongs to both the field of Nuclear Quadrupole Resonance (NQR) and nuclear geomagnetic resonance application. Technically, a nuclear quadrupole resonance detection system and its antenna are provided. The antenna includes two coils to make a gradient antenna wherein they simultaneously receive both the signal from the target region and the external radio frequency interference. Structurally, the first coil is positioned as a regular circular coil, while the second coil is annular and evenly distributed around the first coil peripherally. These coils are on the same plane with equal areas but have opposite winding directions. The systems specific to the disclosed antenna are also included. The configuration of the invented antenna can effectively increase the capability of suppressing environmental electromagnetic radio frequency interference, thereby enhancing the detection of the NQR or geomagnetic resonance signals.

(Continued)

Consequently, the signal-to-noise ratio of the system is improved.

10 Claims, 5 Drawing Sheets

(58) Field of Classification Search
CPC .... G01R 33/307; G01R 33/60; G01R 33/441; G01R 33/34; G01R 33/3614; G01V 3/32; E21B 49/08; E21B 2049/085; G01N 24/10
See application file for complete search history.

(56) References Cited

U.S. PATENT DOCUMENTS

| | | | |
|---|---|---|---|
| 7,362,285 B2 | 4/2008 | Webb et al. | |
| 9,103,857 B2 | 8/2015 | Lammel | |
| 9,812,790 B2 | 11/2017 | Lavedas | |
| 2015/0260812 A1 | 9/2015 | Drake et al. | |
| 2015/0372395 A1* | 12/2015 | Lavedas | H01Q 1/521 343/748 |
| 2017/0040105 A1* | 2/2017 | Peralta | G06K 19/07783 |

FOREIGN PATENT DOCUMENTS

| | | |
|---|---|---|
| CN | 102890197 A | 1/2013 |
| CN | 104502870 A | 4/2015 |
| CN | 204269802 U | 4/2015 |
| CN | 105608484 A | 5/2016 |
| CN | 106291422 A | 1/2017 |

OTHER PUBLICATIONS

International Search Report for Application No. PCT/CN2018/071718.
Written Opinion for Application No. PCT/CN2018/071718.
Chinese Office Action for Application No. 201810014705.7; dated Jan. 4, 2019.
Hemnani Preeti et al: "14N NQR spectrometer for explosive detection: A review", 2016 International Conference on Automatic Control and Dynamic Optimization Techniques, IEEE; Sep. 9, 2016; pp. 1120-1125.
Supplementary European Search Report for EP 18 89 8759.
English Translation to Chinese Office Action for Application No. 201810014705.7; dated Jan. 4, 2019.

* cited by examiner

NUCLEAR QUADRUPOLE RESONANCE DETECTION SYSTEM AND ANTENNA

CROSS REFERENCE TO RELATED APPLICATIONS

This application is a National Stage of PCT Application No. PCT/CN2018/071718 filed on Jan. 8, 2018, the content of which is incorporated herein by reference thereto.

FIELD OF THE INVENTION

The present invention relates to the applied technical field of nuclear quadrupole resonance (NQR) and nuclear geomagnetic resonance, in particular, to a nuclear quadrupole resonance signal detection system and its antenna configuration.

BACKGROUND ART

The signal extracted by the nuclear quadrupole resonance technology objectively reflects the electrical quadrupole moment structure presented by the atomic nucleus under a specific material structure, so this technique can be used to detect and analyze elements or isotopes containing the quadrupole moment nuclear structure, such as Nitrogen 14 (N14), Potassium 39, Chlorine 35, and Chlorine 37, in order to determine if the materials may contain those elements or isotopes. In particular, explosive, nicotine, and drugs generally contain the N14 component, while explosives are a common means that terrorists often use to threaten modern society. Thus, reliable testing of it is a necessary procedure for maintaining public safety. Nuclear quadrupole resonance can be applied to detect the explosive devices, e.g. roadside bombs or mines NQR techniques may also be used for security checks of airport passengers or any public places. Commonly, the quadrupole resonance frequency associated with the explosive component is a range from about 500 KHz up to 5 MHz Compared with the medical magnetic resonance imaging technology, the NQR technique does not require an external magnetic field to be applied.

The nuclear geomagnetic resonance technology uses the magnetic field of the earth as the polarization field Bo required for magnetic resonance experiments, wherein the protons in the hydrogen atoms in the polarized water or petroleum components are excited by resonance magnetic field emitted from an antenna to detect the ground water or oil that causes underground pollution. The strength of the earth magnetic field is about 0.5 Gauss, corresponding to a Lamar frequency of about slightly higher than 2000 Hz.

Both resonance signals mentioned above in common are very weak in amplitude, while their frequencies are distributed in a range of electromagnetic interference born from human culture activities, for example, the interference of 40th harmonic powerline interference frequency (for 50 Hz electric power system) to the nuclear earth magnetic field resonance signal, and the interference of medium and short wave radio broadcasting to the nuclear quadrupole resonance signal. Thus, the electromagnetic interference in the ambient environment becomes a difficult issue when applying these resonance technologies to detect explosives in a non-shielded environment. Therefore, developing antennas while both suppressing those interferences and implementing signal processing methods to improve the signal to noise ratio has been the key to the successful application of these technologies.

Since the above two technologies have the commonalities of technique construction and encounter similar difficulties to be solved in application successfully, we will focus on the development and problems that exist based on the nuclear quadrupole resonance technology. In the narrative, the words "antenna" and "coil" may be used interchangeably depending on the occasion.

Conventionally, a typical structure of an antenna to suppress the external interference is composed of two coils forming a gradiometer. The two coils are connected in such a way to ensure the magnetic vectors generated by two coils are the same in amplitude but opposite in direction in the coil surface. In physics, the field distribution in the space produced by applying a known current is termed as a Lead Field. The distribution of the lead field determines the sensitivity distribution in the space when the applicator is employed for detection. This reciprocal relationship is called the reciprocity theory in the electromagnetic field. Therefore, the characteristics of the aforementioned gradient antenna ensure that the NQR signal generated by the detected explosives located nearby can be detected sharply, while the interference from a remote source is well resisted. This is because, compared to the distance from the interference source, the distance between the two coils in the gradient antenna is very small, and the received interference coming from far away exhibits the same interference intensity and opposite phase on the two coils, thus, the interference detected by the gradient antenna is cancelled from each other in those two coils. For a signal from a nearby explosive that is characterized with a strong gradient, the gradiometer antenna can sense the gradient component readily and the antennas' output signal is then amplified by the subsequent circuit. In practice, in order to improve the signal to noise ratio, the receiving antenna is often tuned to the operating frequency. Such a conventional antenna is satisfactory in most cases. However, in the NQR system, the signal is extremely small and any interference from the interference source, even with a small gradient component, is enough to cause interference to the measured signal, affecting processing analysis and judgment.

Configured similar to the above antenna system, the explosives are positioned proximal to one coil of a gradiometer antenna to receive the NQR signals, while another coil is away from the target, so it only perceives the interference. Since the interference is seen by two coils of the gradiometer that are opposite in phase, the said interference is then cancelled by each other. Such antenna structure with an extra coil for sensing an opposite phase interference consequently increases the thermal noise of the antenna system, thereby reducing the signal to noise ratio.

Another anti-interference antenna that differs from a gradient one is that of several orthogonal coils, say three, which are placed in the vicinity of the main transmitting/measuring coil, to detect the 3 orthogonal components of the interference. These auxiliary antennas are independent of the main measurement antenna and are far enough away from the main antenna not to participate in transmitting electromagnetic fields and receiving NQR signals. In this way, the interference information provided by the auxiliary antenna can be used to effectively eliminate the interference from the main measurement channel by hardware or software processing methods, thereby suppressing interference. Although such an antenna design has been applied to mine inspection, its anti-interference capability is deteriorated if the interference received by the primary measurement antenna is not promisingly correlated with the interference received by the auxiliary antennas. In practice, in order to ensure that the auxiliary antenna is not subject to sensing the interesting information, they must be kept a proper distance from the main antenna, but by doing this the correlation property of interferences sensed by both auxiliary and primary coils may worsen which can cause an increase in the interference remaining in the signal after processing. Conversely, if the distance between the auxiliary coil and the primary measuring coil is reduced to ensure the correlation of the interferences, the auxiliary coil may also detect interesting information, thereby some useful information will be reduced in the analysis thereby lowering the signal-to-noise ratio. Therefore, these conventional embodiments of the antenna system present the pitfall that achieving higher signal to noise ratio is contradictory with better anti-interference capability, even though high anti-interference ability and high signal to noise ratio is highly desired in implementing NQR technology in explosives detection. In this regard, the present invention discloses a new antenna structure, with high anti-interference capability, while maximizing signal to noise ratio.

Technique Problem to Solve

Solving the inherent contradiction issue between a high anti-interference ability and high signal to noise ratio in the conventional technology.

Invention Content

The present invention is to provide a NQR detection system and its antenna for applying NQR technology to detect explosives. The invention can also be used for nuclear geomagnetic resonance to investigate both the underground water and polluted oil. It aims at solving a contradiction in conventional techniques between achieving a high anti-interference and a high signal to noise ratio.

An antenna for NQR technology, the said antenna includes:

The first coil, the said first coil is shaped with a first shape pattern;

The second coil, the said second coil is shaped with the second shape pattern;

Said first coil and said second coil are configured as a gradiometer antenna and they receive radio frequency signals from target region and interference from outside the target area simultaneously;

Wherein the said first coil and the said second coil are positioned in the same plane, but the said first coil and the said second coil are wound in the opposite direction. The said second shape pattern has the same area as the said first shape pattern and is uniformly distributed around the said first shape pattern.

In addition, a detection system for nuclear quadrupole resonance is provided, including:

The first coil, the said first coil is shaped with a first shape pattern;

The second coil, the said second coil is shaped with the second shape pattern;

Said first coil and said second coil are configured as a gradiometer antenna and they receive radio frequency signals from target region and interference from outside the target area simultaneously;

Wherein the said first coil and the said second coil are positioned in the same plane, but the said first coil and the said second coil are wound in the opposite direction. The said second shape pattern has the same area as the said first shape pattern and is uniformly distributed around the said first shape pattern;

An electrical pulse sequence power amplifier. The said electrical pulse sequence power amplifier is connected to the said first coil and the said second coil, respectively, for the said first coil and the said second coil to generate an excitation sequence pulse magnetic field;

A signal receiving unit, configured to receive and process the radio frequency signals sensed by the first coil and the second coil.

In addition, another nuclear quadrupole resonance detection system is provided, including:

The first coil, the said first coil is shaped with the first shape pattern;

the second coil, the said second coil is shaped with the second shape pattern;

Said first coil and said second coil are configured as a gradiometer antenna and they receive radio frequency signals from target region and interference from outside the target area simultaneously;

Wherein the said first coil and the said second coil are positioned in the same plane, but the said first coil and the said second coil are wound in the opposite direction. The said second shape pattern has the same area as the said first shape pattern and is uniformly distributed around the said first shape pattern;

An electrical pulse sequence power amplifier. The said electrical pulse sequence power amplifier is connected to the said first coil and the said second coil, respectively, for the said first coil and the said second coil to generate an excitation sequence pulse magnetic field;

A signal receiving unit, configured to receive and process the radio frequency signals sensed by the first coil and the second coil.

Beneficial Effect

In the above-described nuclear quadrupole resonance detection antenna, the first and the second coil are constructed to form a gradiometer antenna and receive the signals from the target region and external interference at radio frequency simultaneously. Compared with the conventional fig-of-8 antenna, the second coil always plays a role of enhancing the signal no matter if the detected material is symmetrically distributed underneath the antenna in the target region or not, due to the fact that the second coil is uniformly distributed surrounding the first coil. Furthermore, this kind of centrosymmetric configuration of the gradiometer ensures the excellent correlation of the interferences from distance induced by two coils, thus achieving an ideal interference cancellation. Additionally, the second coil of the gradiometer is wound in such a direction that helps the magnetic field of the first coil to form a closed loop; physically, this structure ensures a higher sensitivity to detection signals. In summary, the solution of the present invention can effectively improve the ability of the antenna to suppress radio frequency interference in the environment when detecting either the NQR or the nuclear geomagnetic resonance signal, and enhance the detection capability of the signal, thereby improving the signal-to-noise ratio of the system.

DRAWINGS

DETAILED DESCRIPTION

Figure 1:
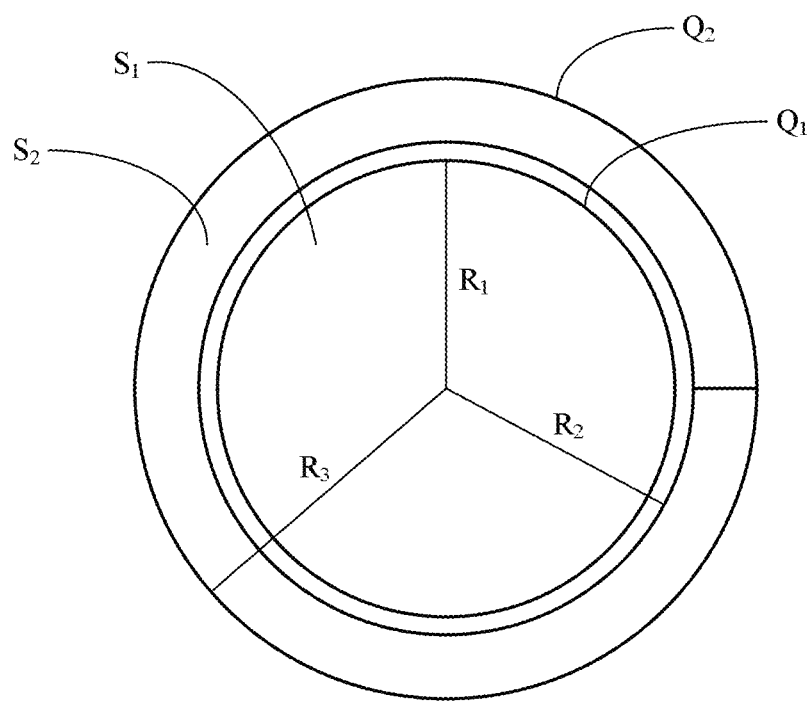
FIG. 1 is a schematic structural diagram of the present invention for a preferred embodiment of the nuclear quadrupole resonance antenna.

In order to make the object, technical solution, and advantages of the present invention clearer, the invention is further clarified with the accompanying drawings and the embodiments. It is understood that the specific embodiments described herein are merely illustrative of the invention and are not intended to limit the invention.

The embodiment of the invention presents an example of implementing the NQR detection system. Specifically, the embodiment of the NQR system includes the NQR detection antenna, the electric pulse sequence power amplifier 200 and the signal receiving unit 300, Wherein the NQR detection antenna is a gradiometer that consists of two coils aligned together, that can cancel the external interference to the signal. The gradiometer is composed of the first coil Q1 and the second coil Q2.

Specifically, the winding directions of the first coil Q1 and the second coil Q2 are opposite and are positioned in the same plane. The first coil Q1 is shaped to the first shape pattern, while the second coil Q2 is shaped to the second shape pattern. The areas of the first shape pattern is equal to the area of the second shape pattern. The second shape pattern is uniformly distributed around the first shape pattern.

Further, the first coil Q1 and the second coil Q2 are both made of good metal conductors (for example, copper wire) rings or are wound by at least one wire; both the first shape pattern formed by the first coil Q1 and the second shape pattern formed by coil Q2 are either axisymmetric or centrosymmetric. In a preferred embodiment, the first shape pattern is formed as a circular area, while the second shape pattern is an annular area that is uniformly distributed around the first shape pattern. In accordance with the preferred embodiment of the present invention, the area of the first shape pattern of Q1 equals the area of the second shape pattern of Q2, i.e. the area of the circular region and the area of the annular region is equal, in particular, the areas meet to the following relationship, $$S_1 = S_2;$$

That is, $\pi R_1^2 = \pi R_3^2 - \pi R_2^2$;

Wherein, $S_1$ $S_2$ represent the areas of the first shape pattern and the second shape pattern, respectively. $R_1$, $R_2$, and $R_3$ are the three radii of the three circles from the inside to the outside, respectively. That is to say, radii of the 3 circles are constrained by the above formula.

When the antenna provided by the embodiment of the present invention is receiving a signal, the gradient antenna composed of the first coil Q1 and the second coil Q2 simultaneously receives both the return radio frequency signal from the target region and the distance interference. The radio frequency electromagnetic interference in the space usually comes from the radio broadcast or power line radiation, which exhibits no gradient characteristics, that is, the distance between the antenna and the interference source is much larger that the dimension of the geometry of the coil itself, so the interference from the far away can be regarded as a uniform distribution in the antenna detection area. In addition, the area of the first shape pattern formed by the first coil Q1 is equal to the area of the second shape pattern formed by the second coil Q2, so according to the Faraday electromagnetic induction law, the induced interference electromotive force in two coils have an identical magnitude. Due to the two coils being wound oppositely, the phase of the induced interference in two coils are also opposite. Therefore, the interference in the first coil exactly cancels out that from the second coil. In contrast, the echo signal from the detected material in the target region is strongly characterized with a large gradient and cannot be cancelled out in the gradiometer. Instead, the signals are superimposed in the two coils together, thus enhancing the signal while suppressing the interference. The signal to noise ratio is then enhanced, too. In particular, the second coil Q2 is uniformly distributed around the first coil Q1 that ensures maximum possibility that first coil Q1 and the second coil Q2 receive the interference identically. Regardless, the detection material in the target region is symmetrically distributed relative to the antenna center, the antenna can effectively enhance the signal while eliminating interference.

Further, the first coil Q1 and the second coil Q2 are both metal rings of a good conductor (for example, a copper conductor) or are wound by at least one wire, and the optimized number of turns depends on the operating frequency. Both the first shape pattern formed by coil Q1 and the second shape pattern formed by coil Q2 are either axisymmetric or centrosymmetric. In the preferred embodiment, the first shape pattern is a circular area, while the second shape pattern is an annular area and evenly distributed around the first shape pattern so that the first and the second shape patterns share the same center of symmetry. Thus, the first coil Q1 and the second coil Q2 integrally form a completely symmetric antenna structure. When the antenna receives the signal, the second coil Q2 receives the return radio frequency signal from the detected object to the greatest extent, and the signals of the first coil Q1 and the second coil Q2 are superimposed together to enhance the signal strength in phase, thereby achieving the maximum signal to noise ratio of the gradient receiving antenna. The second coil can always play a role of enhancing the signal by superimposing the signal to the signal detected by the first coil, no matter if the detected material is positioned symmetrically to the antenna center or not.

In principle, the first coil Q1 and the second coil Q2 in the antenna in the nuclear quadrupole resonance test have two states, i.e., transmission and reception. Just as in the conventional NQR technique, the antenna is first in the transmitting state to emit an electromagnetic wave, in order to excite the detected element in the target region to a higher energy state. Then transmitting is stopped and the antenna is turned into the receiving state, to receive and to amplify the interesting signals. Correspondingly, the antenna has two modes of transmitting and receiving. The following description focuses on the NQR detecting system in two different embodiments configured by two different transmitting and receiving modes, while ignoring a central sequence control unit that is well known to technique people who work in the field.

Figure 2:
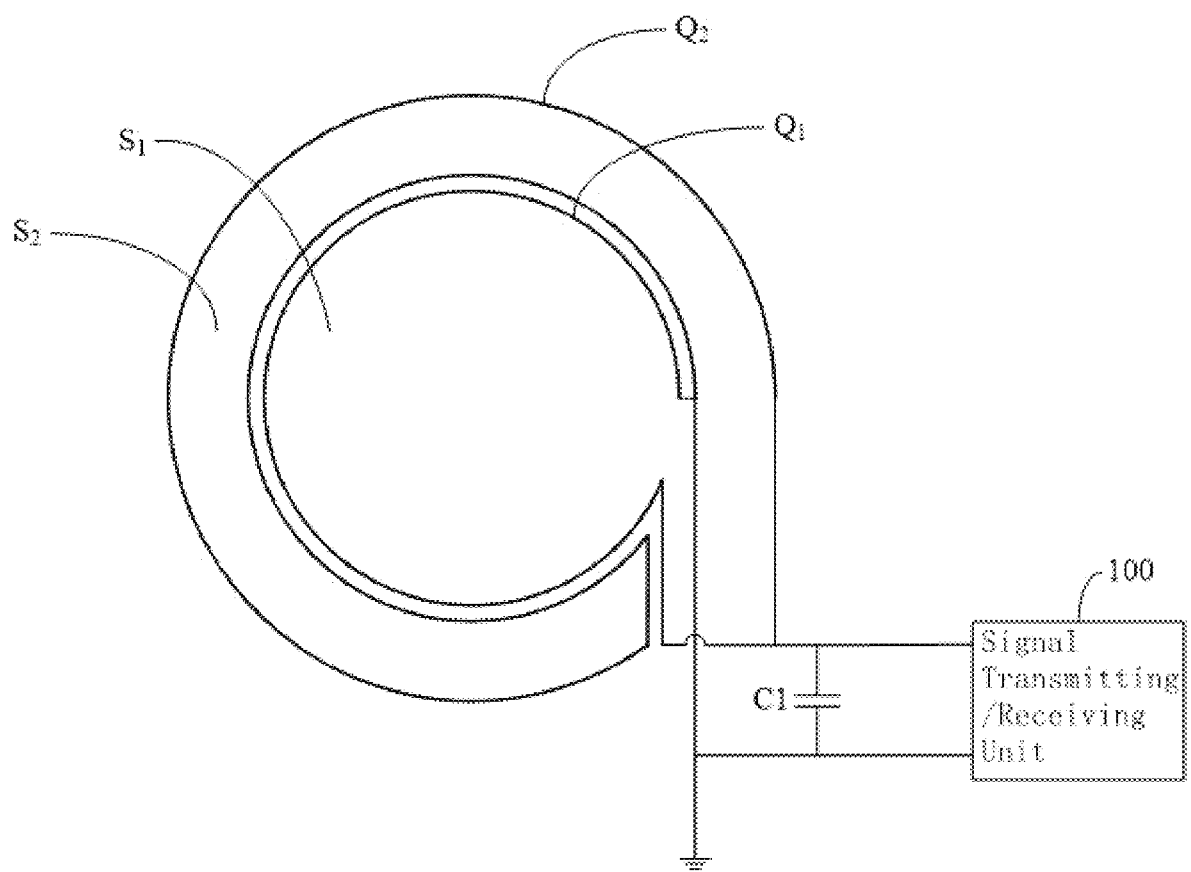
FIG. 2 is a schematic structural diagram of the present invention for the first embodiment of the nuclear quadrupole resonance detection system.

In the first embodiment shown in FIG. 2, the first coil Q1 and the second coil Q2 are connected in parallel, and the electric pulse sequence power amplifier and a signal receiving unit are combined to form a signal transmitting and receiving unit 100. As in a conventional NQR system, the system is working between transmitting and receiving modes sequentially. In the signal transmitting/receiving unit 100, a classical T network resonating at the operating frequency realizes time-division transmitting and receiving signals that simplifies the circuit for easy to operate.

In the shared transmitting and receiving loop, the first coil Q1 and the second coil Q2 are connected in parallel with a capacitor C1 to form a parallel resonance circuit. The receiving circuit is isolated during transmission. The power amplifier in the instrument is subjected to a certain excitation sequence (for example, commonly used CPMG sequence to obtain echo signals) delivers electric pulse sequence to the antenna, which converts pulse sequence into a radio frequency magnetic field and applies to a target object to excite the nuclear quadrupole moment to a higher energy state, then this quadrupole moment at higher energy state jumps down to a lower energy state, during that process an electromagnetic signal at the same frequency as emitted magnetic field is radiated, that is NQR signal. This signal is received by the same antenna that was already changed to reception mode after transmitting. The signal is then fed to the receiving amplifier to be enhanced before for post analysis. Note that the antenna that is combined with the first coil Q1 and the second coil Q2 becomes a gradiometer in receiving mode to receive both NQR signal from the target region and interference. The interference detected by the two coils in the gradiometer cancels each other, resulting in NQR signal remains. In practical applications, the impedance of the antenna can be changed by conventional means to achieve the standard 50 Ohms, to facilitate matching amplifiers.

Figure 3:
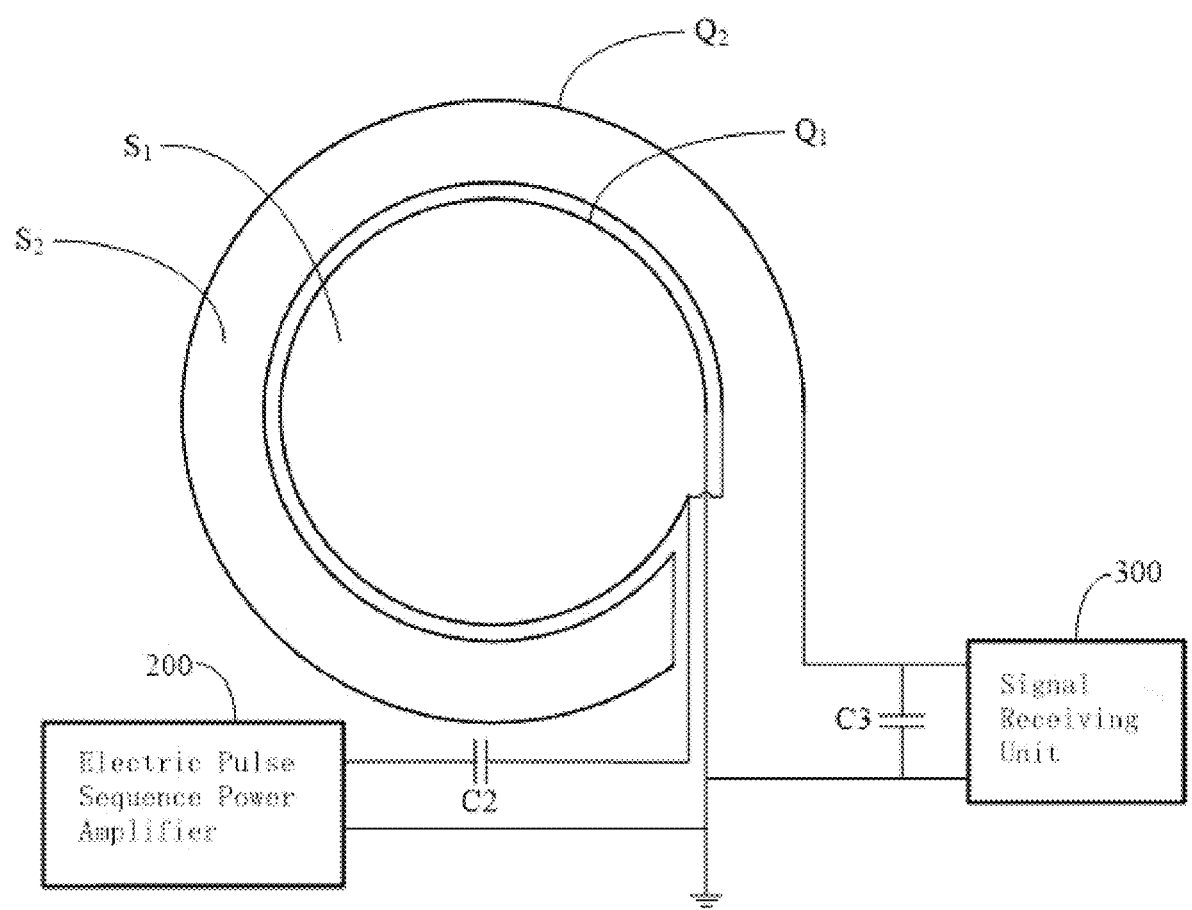
FIG. 3 is a schematic structural diagram of the present invention for the second embodiment of nuclear quadrupole resonance detection system.
Figure 4:
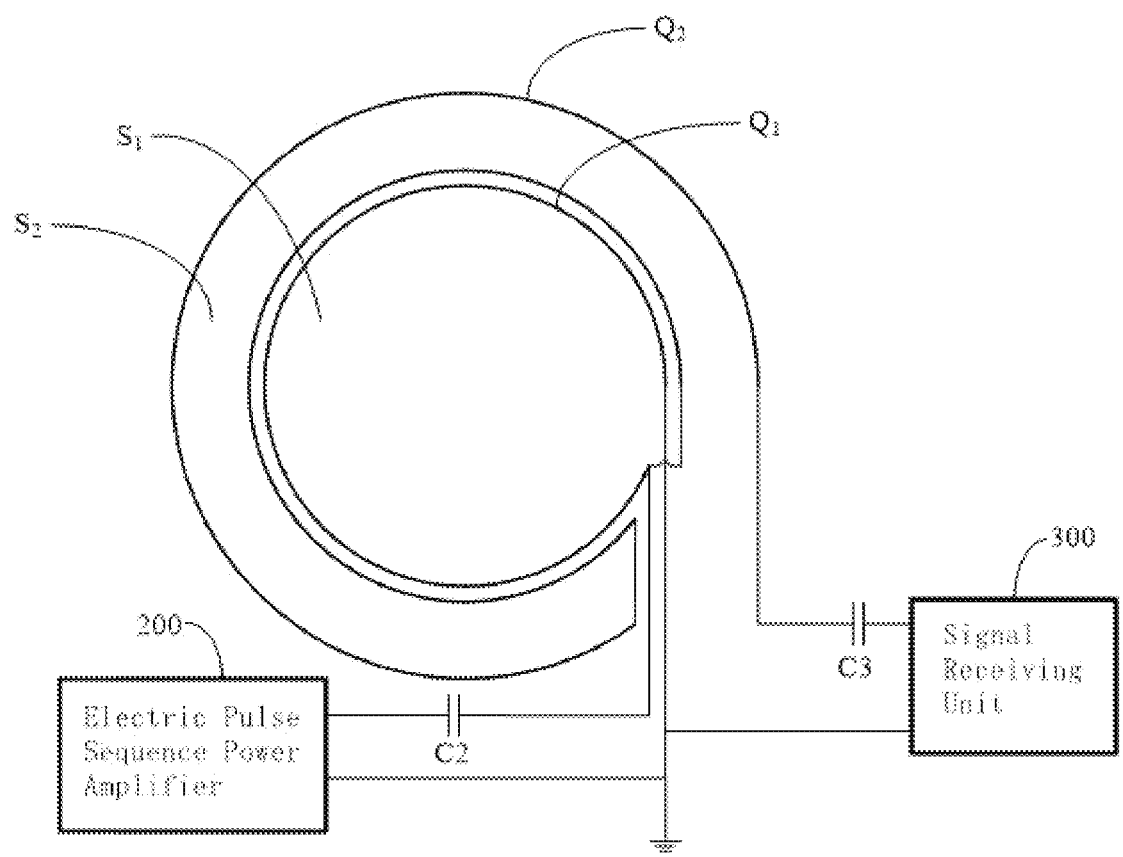
FIG. 4 is a schematic structural diagram of the present invention for the second implementation of the second embodiment of nuclear quadrupole resonance detection system.

The second embodiment of the present invention for the NQR testing system is schematically and structurally shown in FIG. 3 and FIG. 4. In this embodiment, the transmitting and receiving circuits are tuned to achieve resonance at the operating frequency separately. In the transmission circuit, the capacitor C2 and the first coil Q1 are connected in series. Thus, the transmitting loop presents a low impedance at resonant frequency, which facilitates applying a low voltage driving from the electric pulse sequence power amplifier 200. The electric pulse sequence power amplifier 200 is only connected to the first coil Q1 for driving it to generate and to emit a radio frequency signal to form an excitation sequence pulse magnetic field; the signal receiving unit 300 is configured to receive and process the signal detected by the combination of the first coil Q1 and the second coil Q2. Then the signal is further analyzed to determine whether the explosive material exists in the detection target region. In particular, the first coil Q1 is connected in series with a second capacitor C2. This capacitor C2 is then connected to the electrical pulses power amplifier 200. During transmission, the transmitting loop presents a low impedance property which benefits the power amplifier 200 to output relative low driving voltage. Therefore, a low voltage power source such as a car battery can be employed to power the amplifier, that helps the NQR detection system conveniently adapt to work in the field to detect a suspicious substance.

In this embodiment of the current invention, the receiving circuit is implemented in two ways, i.e., one is a parallel resonance loop, as shown in FIG. 3, while the other is a series resonance loop, as shown in FIG. 4. These two implementations are discussed in detail below.

As shown in the FIG. 3, when the antenna of the NQR system is in receiving mode, the transmit circuit is turned off, the first coil Q1 and the second coil Q2 are connected in series, that then is connected with the capacitor C3 in parallel to constitute a parallel resonant circuit. The output signal of this parallel resonant circuit is fed to a preamplifier in the receiving unit 300 via an isolation network for amplification. In the transmission mode, the input of the receiving unit 300 is set to a high impedance isolation mode, while the capacitor C3 and the coil Q2 forms a parallel resonant loop that absorbs a portion of the energy in the first coil Q1 to generate emission current. Thus, the second coil Q2 is also involved in transmitting excitation electromagnetic fields. After the transmission, the power amplifier 200 is automatically disconnected by embedded electronics so that it does not affect the parallel resonant loop that is composed of the first coil Q1 and the second coil Q2, as well as the capacitor C3. The parallel resonant loop presents a high impedance to receive the signal emitted from the material under test in the target region. Therefore, in this mode, the input amplifier of the signal receiving unit 300 must be high input impedance.

In FIG. 4, the receiving resonant loop is composed of the capacitor C3 and the first coil Q1, as well as the second coil Q2 which are connected in series. After transmitting an excitation pulse sequence, this receiving antenna starts to detect signal. Due to the series resonance, the receiving loop exhibits a low impedance so that the input amplifier in the signal receiving unit 300 must be low input impedance. In transmission mode, the preamplifier in the receiving unit 300 is isolated from the antenna via an isolation network embedded in the unit, thus there is no induced current in the receiving loop, that ensures the receiving loop does not participate in the emission. In this case, the transmitting antenna is simply a circular coil.

Figure 5:
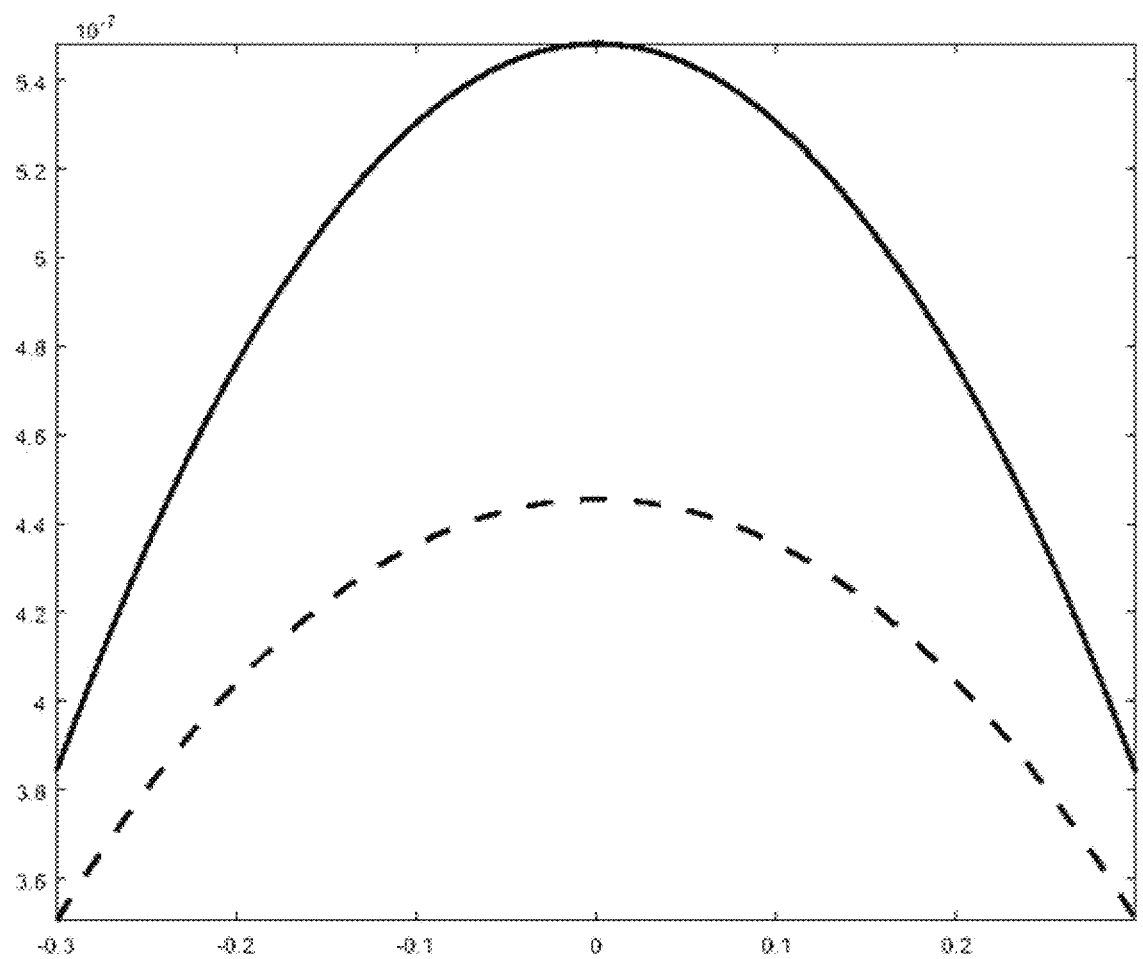
FIG. 5 is a schematic view showing the distribution of the vertical component (Bz) of the excitation magnetic field generated by the antenna at a depth of 05 meter under the antenna plane along an arbitrary radial direction in the first and the second embodiment of the present invention.

The lead field distribution of the disclosed antenna mentioned above is illustrated in FIG. 5. This is also equivalently the sensitivity profile when the antenna is used for detection. The curve Bz is numerically calculated based on an unit current excitation of one turn disclosed antenna at a plane of 0.5 meter underneath the antenna assembly. The vertical magnetic component Bz (to the coil plane) along a radial direction is plotted. According to the law of reciprocity, the curve also reflects the spatial sensitivity distribution of the antenna for detection. Here, the solid line in the figure is the field distribution of the first coil Q1 driven by the unit current, and the broken line is the field distribution when the first coil Q1 and the second coil Q2 constitute the gradient antenna. Obviously, this disclosed gradient antenna structure in the invention improves the ability to receive signals.

In the second embodiment of the present invention, i.e., the NQR detection system shown in FIG. 3 and FIG. 4, the first coil Q1 acts as a transmitting antenna to transmit a detecting radio frequency signal to the target area in the transmitting mode. The transmitting antenna in structure is circular formed by the first coil Q1. Given the dimension of the coil, a simple circular configuration has the best penetration depth when exciting a target. This circular structure transmitting antenna formed by the preferred embodiment in the transmission mode greatly improves the detection depth or detection range compared to the conventional gradient antenna. Correspondingly, in the preferred embodiment, the second shape pattern of the second coil Q2 is taken as an annular region and is distributed around the first shape pattern of the first coil Q1 such that the first shape pattern and the second shape pattern have a common centrosymmetric point. Consequently, a completely symmetrical antenna structure is constructed by the entirety of the first coil Q1 and the second coil Q2. In the receiving mode, the first coil Q1 and the second coil Q2 constitute a gradient antenna, sensing the signal simultaneously. The remote interference induced in the antenna is then cancelled out when signals are superimposed by two coils. At the same time, the second coil Q2 receives the return ratio frequency signal emitted from the detected object to the greatest extent, thereby achieving the maximum signal to noise ratio. And since the second coil Q2 is evenly distributed around the first coil Q1 peripherally, the second coil Q2 acts to enhance the signal no matter if the material under test is distributed symmetrically under the antenna or not.

The foregoing is only the preferred embodiments of the present invention and is not intended to limit the present invention. Any modifications and equivalent substitutions and improvements made within the spirit and principle of the present invention, should be included in the protected scope of the present invention.

What is claimed is:

1. A Nuclear Quadrupole Resonance (NQR) antenna assembly, comprising:
    a first coil, the first coil being shaped with a first shape pattern; and
    a second coil, the second coil being shaped with a second shape pattern;
    wherein a gradient antenna is constructed by combining the first coil and the second coil, which simultaneously receives both the radio frequency signal from a target area and an external interference;
    wherein the first coil and the second coil are in the same plane, the first coil and an outer loop of the second coil are operably coupled together in electrical opposition to each other, and wherein the first shape pattern is circular, the second shape pattern has a ring shape and is uniformly distributed outside the first shape pattern, an area of the first shape pattern is equal to an area of the second shape pattern.

2. The NQR antenna assembly, as claimed in claim 1, wherein the first coil is a metal ring or at least a single-turn, or multi-turn conductor wire antenna.

3. The NQR antenna assembly, as claimed in claim 1, wherein the second coil is a metal ring or at least a single-turn, or multi-turn conductor wire antenna.

4. A nuclear quadrupole resonance test system, comprising:
    a first coil, the being shaped with a first shape pattern; and
    a second coil, the second coil being shaped with a second shape pattern;
    wherein a gradient antenna constructed by combining the first coil and the second coil is configured to receive both a signal from a target area and a external radio frequency interference simultaneously;
    wherein the first coil and the second coil are on the same plane, the first coil and an outer loop of the second coil are operably coupled together in electrical opposition to each other, and wherein the first shape pattern is circular, the second coil has a ring shape and is uniformly distributed outside the first coil peripherally, an area of the first coil and an area of the second coil are equal;
    an electric pulse sequence power amplifier, the electric pulse sequence power amplifier are connected to both the first coil and the second coil, in order for the first coil and the second coil to generate an excitation sequence pulse magnetic field;
    a signal receiving unit, the signal receiving unit is configured to receive and to process the radio frequency signals detected by the first coil and the second coil.

5. The NQR test system, as claimed in claim 4, wherein the first coil is connected to the second coil in parallel, that both the electric pulse sequence power amplifier and the signal receiving unit are connected to a common end of the first coil and the second coil.

6. The NQR test system, as claimed in claim 4, wherein the system comprises a first capacitor and the first capacitor is connected to both the first coil and the second coil in parallel, that the first capacitor and the first coil, as well as the second coil construct a parallel resonant circuit.

7. A nuclear quadrupole resonance test system, comprising:
    a first coil, the first coil being shaped with a first shape pattern; and
    a second coil, the second coil being shaped with a second shape pattern;
    wherein a gradient antenna constructed by combining the first coil and the second coil is configured to receive both a signal from target area and an external radio frequency interference simultaneously;
    wherein the first coil and the second coil are on the same plane, the first coil and an outer loop of the second coil are operably coupled together in electrical opposition to each other, and wherein the first shape pattern is circular, the second coil is uniformly distributed outside the first coil peripherally, an area of the first coil and an area of the second coil are equal,
    an electric pulse sequence power amplifier, the electric pulse sequence power amplifier are connected to both the first coil and the second coil, in order for the first coil and the second coil to generate an excitation sequence pulse magnetic field;
    a signal receiving unit, the signal receiving unit is configured to receive and to process the radio frequency signals detected by first coil and the second coil.

8. The NQR test system, as claimed in claim 7, wherein the first coil is connected to the second coil in series, that a first end of the first coil is connected to a first end of the second coil, that both a second end of the first coil and a second end of the second coil are connected to the signal receiving, unit.

9. The NQR test system, as claimed in claim 7, wherein the system further comprises a second capacitor and a third capacitor, the second capacitor is connected to the first coil in series and the third capacitor is connected to the second coil in parallel.

10. The NQR test system, as claimed in claim 7, wherein the system further comprises a second capacitor and a third capacitor, the second capacitor is connected to the first coil in series, while the third capacitor is connected to the first coil and the second coil in parallel.

* * * * *